United States Patent
Tsai et al.

(10) Patent No.: US 7,713,820 B2
(45) Date of Patent: May 11, 2010

(54) METHOD FOR MANUFACTURING NON-VOLATILE MEMORY

(75) Inventors: Hung-Mine Tsai, Kaohsiung (TW); Ching-Nan Hsiao, Kaohsiung County (TW); Chung-Lin Huang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 185 days.

(21) Appl. No.: 11/945,199

(22) Filed: Nov. 26, 2007

(65) Prior Publication Data

US 2009/0061581 A1 Mar. 5, 2009

(30) Foreign Application Priority Data

Sep. 3, 2007 (TW) .............................. 96132740 A

(51) Int. Cl.
*H01L 21/336* (2006.01)
(52) U.S. Cl. .................... 438/259; 438/211; 438/257; 438/267; 257/E21.422
(58) Field of Classification Search ................ 438/481, 438/264, 198, 211, 257, 259, 267; 257/E21.422
See application file for complete search history.

(56) References Cited

U.S. PATENT DOCUMENTS

| | | | | |
|---|---|---|---|---|
| 5,973,356 A | * | 10/1999 | Noble et al. ................ 257/319 |
| 6,049,114 A | * | 4/2000 | Maiti et al. ................. 257/412 |
| 6,433,382 B1 | * | 8/2002 | Orlowski et al. ............ 257/315 |
| 6,613,690 B1 | * | 9/2003 | Chang et al. ................ 438/712 |
| 2003/0122181 A1 | * | 7/2003 | Wu ............................ 257/315 |
| 2004/0077147 A1 | * | 4/2004 | Lin ............................ 438/259 |
| 2005/0212032 A1 | * | 9/2005 | Ding .......................... 257/314 |
| 2006/0205162 A1 | * | 9/2006 | Suh ............................ 438/286 |
| 2006/0275985 A1 | * | 12/2006 | Chuang et al. .............. 438/257 |
| 2008/0121961 A1 | * | 5/2008 | Schloesser .................. 257/302 |
| 2009/0047765 A1 | * | 2/2009 | Tsai et al. ................... 438/264 |

* cited by examiner

*Primary Examiner*—Thanh V Pham
*Assistant Examiner*—Duy T Nguyen
(74) *Attorney, Agent, or Firm*—Jianq Chyun IP Office

(57) ABSTRACT

A method for manufacturing a non-volatile memory is provided. An isolation structure is formed in a trench formed in a substrate. A portion of the isolation structure is removed to form a recess. A first dielectric layer and a first conductive layer are formed sequentially on the substrate. Bar-shaped cap layers are formed on the substrate. The first conductive layer not covered by the bar-shaped cap layers is removed to form first gate structures. A second dielectric layer is formed on the sidewalls of the first gate structures. A third dielectric layer is formed on the substrate between the first gate structures. A second conductive layer is formed on the third dielectric layer. The bar-shaped cap layers and a portion of the first conductive layer are removed to form second gate structures. A doped region is formed in the substrate at two sides of each of the second gate structures.

30 Claims, 14 Drawing Sheets

METHOD FOR MANUFACTURING NON-VOLATILE MEMORY

CROSS-REFERENCE TO RELATED APPLICATION

This application claims the priority benefit of Taiwan application serial no. 96132740, filed on Sep. 3, 2007. The entirety of the above-mentioned patent application is hereby incorporated by reference herein and made a part of this specification.

BACKGROUND OF THE INVENTION

1. Field of the Invention

The present invention relates to a method for manufacturing an isolation structure and a memory, and in particular, to a method for manufacturing a trench isolation structure and a non-volatile memory.

2. Description of Related Art

A memory is a semiconductor device designed to store data. As the microprocessors in computers become more powerful than ever to be compatible with growingly massive amount of programs and calculations executed by the software, the capacity of the memory needs to be increased accordingly. The developments of memories move toward manufacturing large-storage and low-cost memories to meet the requirements in the semiconductor manufacture.

Among various kinds of memory products, the non-volatile memory is a kind of memory characterized by the advantages that it allows multiple data storing, reading or erasing operations and the stored data therein will be retained after the device is not powered. Hence, the non-volatile memory has become a widely adopted memory device in personal computers and electronic equipments.

In regard to the operation of the non-volatile memory, generally, if the coupling ratio of a device is large, the work voltage required for operating the device is low. The method of increasing the coupling ratio includes increasing an overlap area between the floating gate and the control gate, reducing the thickness of the dielectric layer between the floating gate and the control gate, and increasing the dielectric constant of the dielectric layer between the floating gate and the control gate. However, the general non-volatile memory usually has a problem of an overly low coupling ratio. The problem affects the electron flowing efficiency when a programming operation or an erasing operation is performed. Therefore, the work efficiency of the non-volatile memory is reduced.

SUMMARY OF THE INVENTION

Accordingly, the present invention is directed to a method for manufacturing a non-volatile memory, which can increase the coupling ratio of a device efficiently.

The present invention is further directed to a method for manufacturing a trench isolation structure, by which a layer in a subsequent process can be filled into a place under the surface of the substrate.

The present invention provides a method for manufacturing a non-volatile memory. The method includes providing a substrate having a trench formed therein at first. Then, an isolation structure is formed in the trench. Next, a portion of the isolation structure is removed to form a recess between the top portion of the trench and the isolation structure. After that, a first dielectric layer is formed on the substrate. Thereafter, a first conductive layer is formed on the first dielectric layer, and the first dielectric layer completely fills the recess. Afterwards, a plurality of bar-shaped cap layers is formed on the substrate, wherein the extending direction of the bar-shaped cap layers is across that of the isolation structure. Then, the first conductive layer not covered by the bar-shaped cap layers is removed to form a plurality of first gate structures. Next, a second dielectric layer is formed on sidewalls of the first gate structures. After that, a third dielectric layer is formed on the substrate between the first gate structures. Then, a second conductive layer is formed on the third dielectric layer, and the second conductive layer completely fills the recess. Afterwards, the bar-shaped cap layers and a portion of the first conductive layer are removed to form a plurality of second gate structures. Then, a doped region is formed in the substrate at two sides of each of the second gate structures.

According to an embodiment of the present invention, in the method for manufacturing the non-volatile memory, the method of removing a portion of the isolation structure includes performing a wet etching process, for example.

According to an embodiment of the present invention, in the method for manufacturing the non-volatile memory, the method of forming the trench includes, for example, sequentially forming a pad layer and a hard mask layer on the substrate at first. Then, a patterning process is performed.

According to an embodiment of the present invention, in the method for manufacturing the non-volatile memory, the method of forming the isolation structure includes, for example, forming an isolation material on the substrate at first, wherein the isolation material completely fills the trench. Then, a planarization process is performed for removing the isolation material on the hard mask layer. After that, the hard mask layer is removed.

According to an embodiment of the present invention, in the method for manufacturing the non-volatile memory, the method of forming the first dielectric layer includes performing a thermal oxidation process, for example.

According to an embodiment of the present invention, in the method for manufacturing the non-volatile memory, the method of forming the first conductive layer includes, for example, forming a conductive material layer on the substrate at first, wherein the conductive material layer covers the isolation structure and completely fills the recess. Then, a planarization process is performed to remove a portion of the conductive material layer until the isolation structure is exposed.

According to an embodiment of the present invention, in the method for manufacturing the non-volatile memory, an etching back process can be performed to remove a portion of the isolation structure after the bar-shaped cap layers are formed but before the first conductive layer not covered by the bar-shaped cap layers is removed.

According to an embodiment of the present invention, in the method for manufacturing the non-volatile memory, the method of forming the second dielectric layer includes, for example, conformally forming a dielectric material layer on the substrate at first. Then, a dry etching process is performed.

According to an embodiment of the present invention, in the method for manufacturing the non-volatile memory, the method of forming the third dielectric layer includes performing a thermal oxidation process, for example.

According to an embodiment of the present invention, in the method for manufacturing the non-volatile memory, the method of forming the second conductive layer includes, for example, forming a conductive material layer on the substrate at first, wherein the conductive material layer fills the gap between the first gate structures. Then, a planarization process is performed to remove a portion of the conductive material layer until the first gate structures are exposed.

According to an embodiment of the present invention, in the method for manufacturing the non-volatile memory, a portion of the second conductive layer can be removed at first after the second conductive layer is formed but before the bar-shaped cap layers and a portion of the first conductive layer are removed. Then, an oxidation process is performed on the remaining second conductive layer to form a cap layer thereon. After that, a metal hard mask layer is formed on the cap layer.

According to an embodiment of the present invention, in the method for manufacturing the non-volatile memory, the method of forming the second gate structures further includes, for example, a first oxidation process is performed on the first conductive layer and forming a spacer on the sidewall of the second conductive layer after removing the bar-shaped cap layers but before removing a portion of the first conductive layer. After that, a portion of the first conductive layer is removed by using the spacer as a mask. Thereafter, a second oxidation process is performed on the remaining first conductive layer.

According to an embodiment of the present invention, in the method for manufacturing the non-volatile memory, an etching back process can be performed to remove a portion of the isolation structure after the spacer is formed but before a portion of the first conductive layer is removed.

According an embodiment of the present invention, in the method for manufacturing the non-volatile memory, the top of the isolation structure is at a level higher than the surface of the substrate.

The present invention further provides a method for manufacturing a trench isolation structure. The method includes forming a trench in the substrate at first. Then, an isolation structure is formed in the trench. After that, a wet etching process is performed to remove a portion of the isolation structure for forming a recess between the top portion of the trench and the isolation structure.

According to an embodiment of the present invention, in the method for manufacturing the trench isolation structure, the method of forming the trench includes, for example, sequentially forming a pad layer and a hard mask layer on the substrate at first. Then, a patterning process is performed.

According to an embodiment of the present invention, the method for manufacturing the trench isolation structure includes, for example, forming an isolation material on the substrate at first, wherein the isolation material completely fills the trench. Then, a planarization process is performed for removing the isolation material on the hard mask layer. After that, the hard mask layer is removed.

According to an embodiment of the present embodiment, in the method for manufacturing the trench isolation structure, the top of the isolation structure is at a level higher than the surface of the substrate.

According to the present invention, after the isolation structure is formed in the trench, a portion of the isolation structure is removed by performing the wet etching process to form a recess between the top portion of the trench and the isolation structure, and thereby the conductive layers which respectively serve as the floating gate and the control gate can be filled into the recess for forming the floating gate and the control gate with a larger size, so as to increase the overlap area between the floating gate and the control gate, and to increase the coupling ratio of a device and improve operation efficiency of the device.

In order to make the aforementioned features and advantages of the present invention more comprehensible, several embodiments accompanied with figures are described in detail below.

DESCRIPTION OF EMBODIMENTS

Figure 1A:
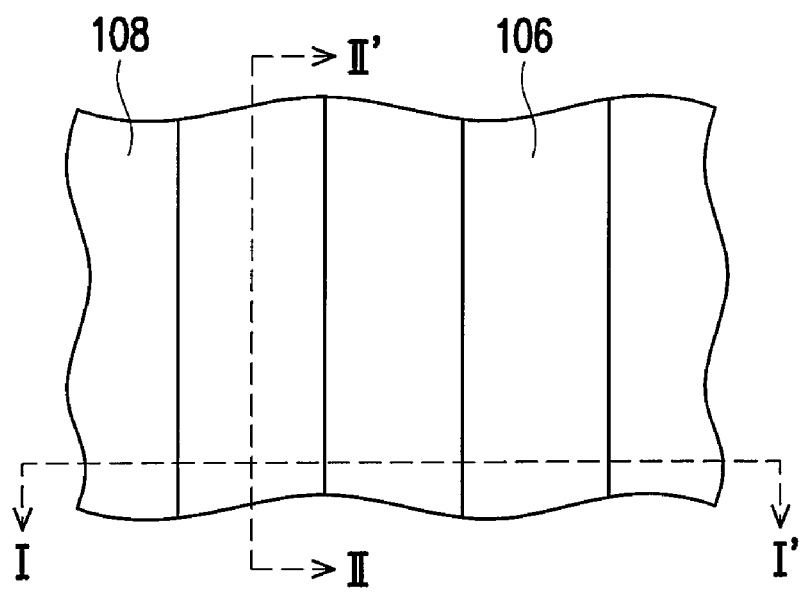
FIGS. 1A to 1G are schematic top views of a non-volatile memory device according to an embodiment of the present invention.
Figure 2A:
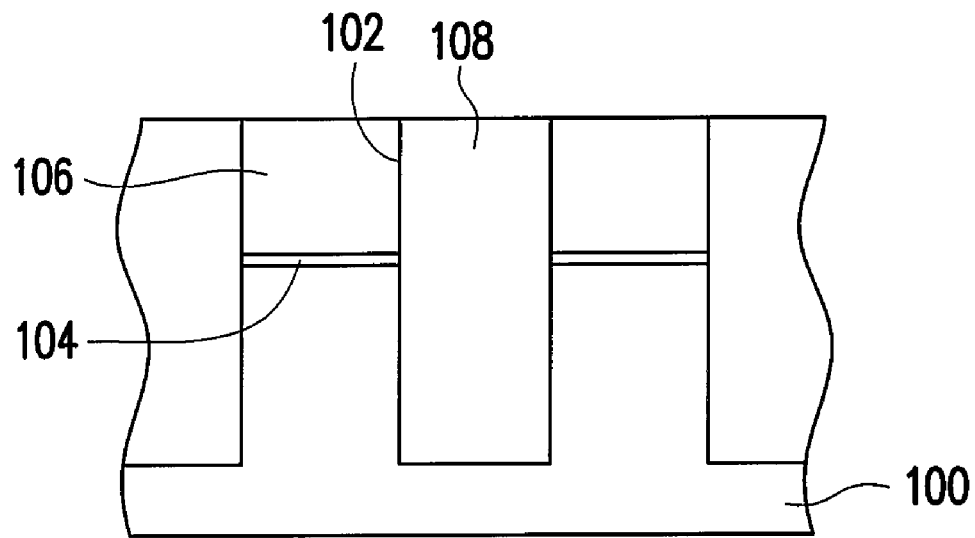
FIGS. 2A to 2G are schematic cross-sectional views along a line I-I' of FIGS. 1A to 1G.
Figure 3A:
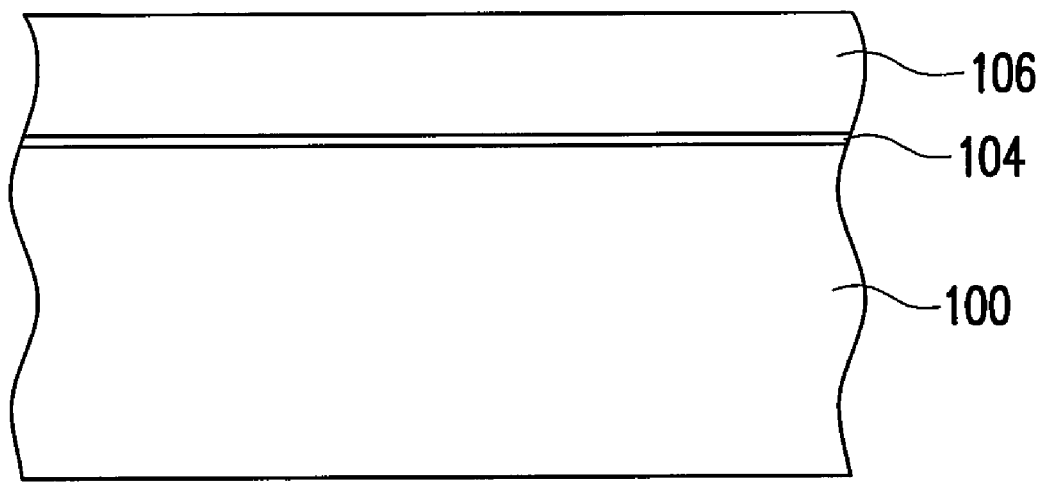
FIGS. 3A to 3G are schematic cross-sectional views along a line II-II' of FIGS. 1A to 1G.

Referring to FIGS. 1A, 2A and 3A at first, a substrate 100 having a trench 102 formed therein is provided. The method of forming the trench 102 includes, for example, forming a pad layer 104 and a hard mask layer 106 on the substrate sequentially. Then, a photolithography process and an etching process are performed to pattern the hard mask layer 106, the pad layer 104 and the substrate 100. The material of the pad layer 104 includes, for example, silicon oxide. The method of forming the pad layer 104 includes, for example, a thermal oxidation process. The material of the hard mask layer 106 includes, for example, silicon nitride. The method of forming the hard mask layer 106 includes performing a chemical vapor deposition process, for example.

Referring to FIGS. 1A, 2A and 3A, an isolation material (not shown) is formed on the substrate 100 by performing a high density plasma chemical vapor deposition (HDPCVD) process, for example. The isolation material completely fills the trench 102. The isolation material is constituted by silicon oxide, for example. Then, a planarization process is performed to remove excessive isolation material on the hard mask layer 106 by using a chemical-mechanical polishing process, so as to form an isolation structure 108 in the trench 102. The isolation structure 108 is a so-called shallow trench isolation (STI) structure.

Figure 1B:
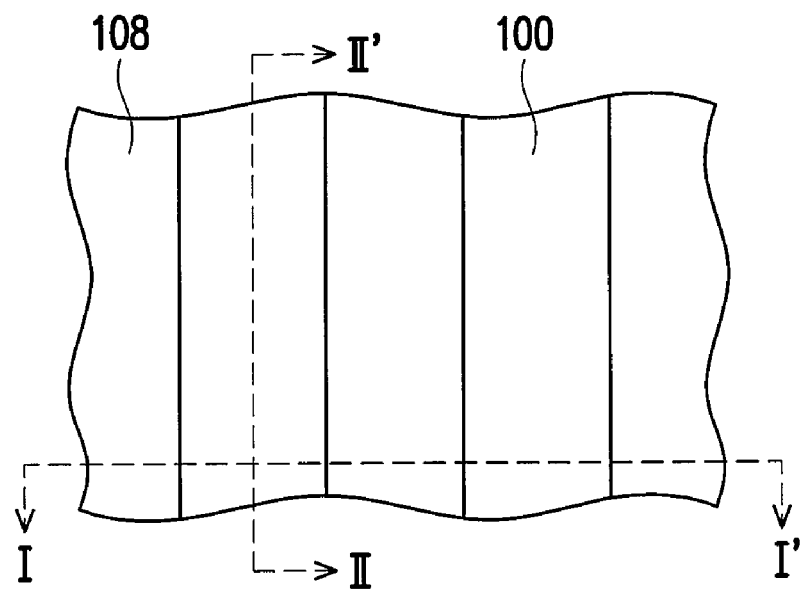
Figure 2B:
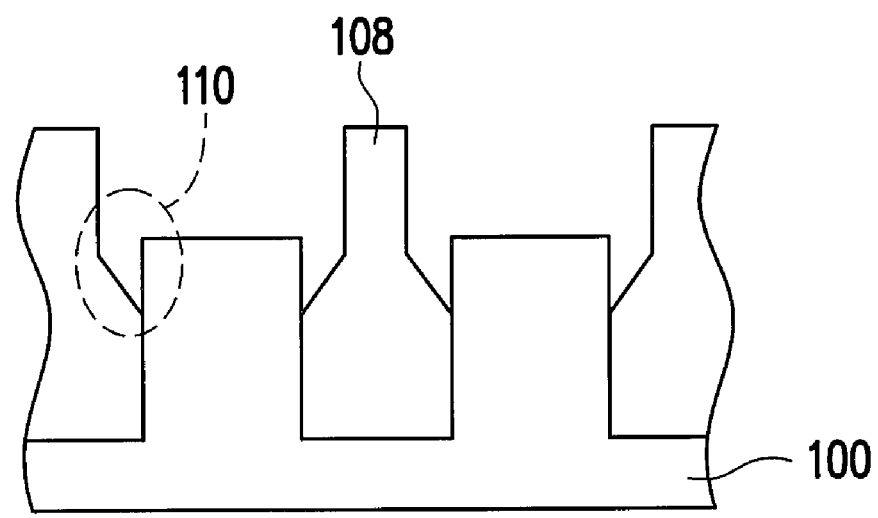
Figure 3B:
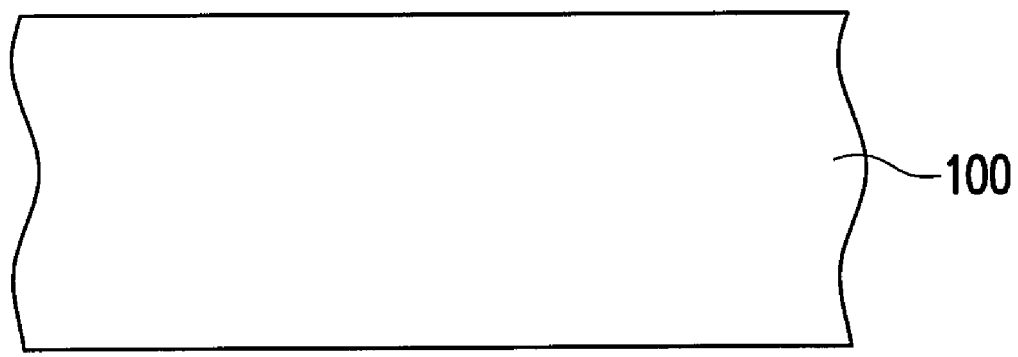

After that, referring to FIGS. 1B, 2B and 3B, the hard mask layer 106 is removed. Thereafter, a wet etching process is performed to remove a portion of the isolation structure 108 for forming a recess 110 between the top portion of the trench 102 and the isolation structure 108. In details, in order to fill spaces around the isolation structures 108 with sufficient amount of material in a subsequent process after the hard mask layer 106 is removed, the wet etching process is performed to remove a portion of the isolation structure 108 at the top portion of the trench 102, and thereby the material of the layer in the subsequent process can be filled into the formed recess 110. Of course, the depth of the formed recess should be determined depending on the actual situation, so as to prevent the isolation structure from being over etched, and thereby the size of the subsequently formed floating gate and control gate is overly small, so that the deduction of the coupling ratio is avoided.

Figure 1C:
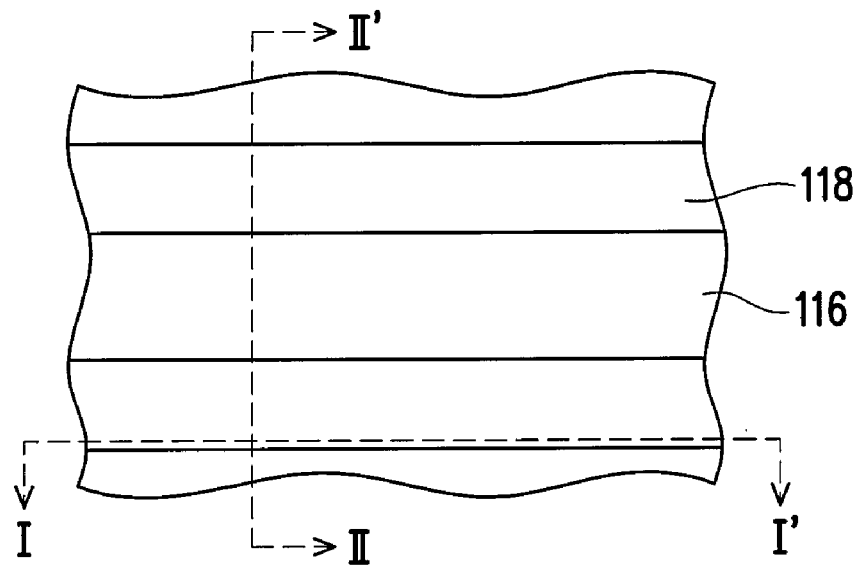
Figure 1D:
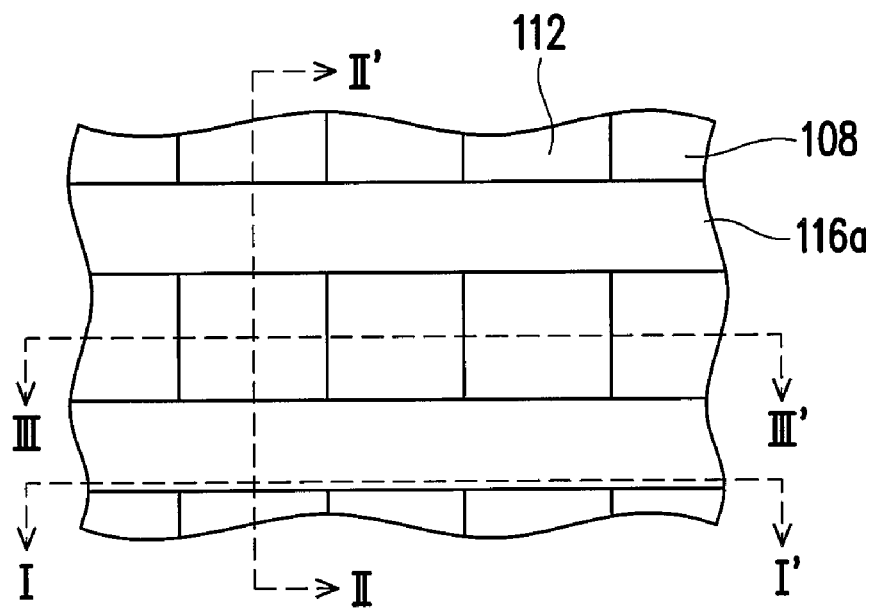
Figure 1E:
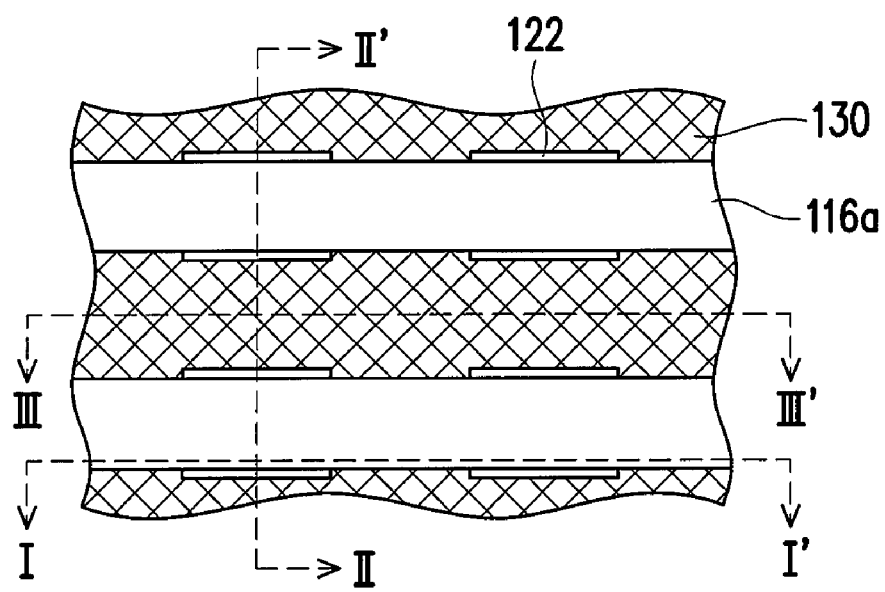
Figure 1F:
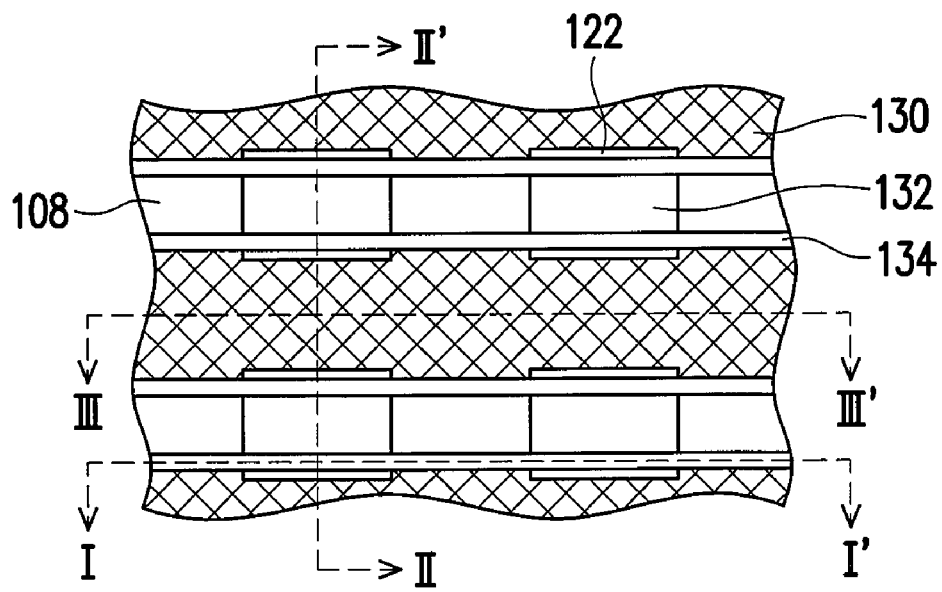
Figure 1G:
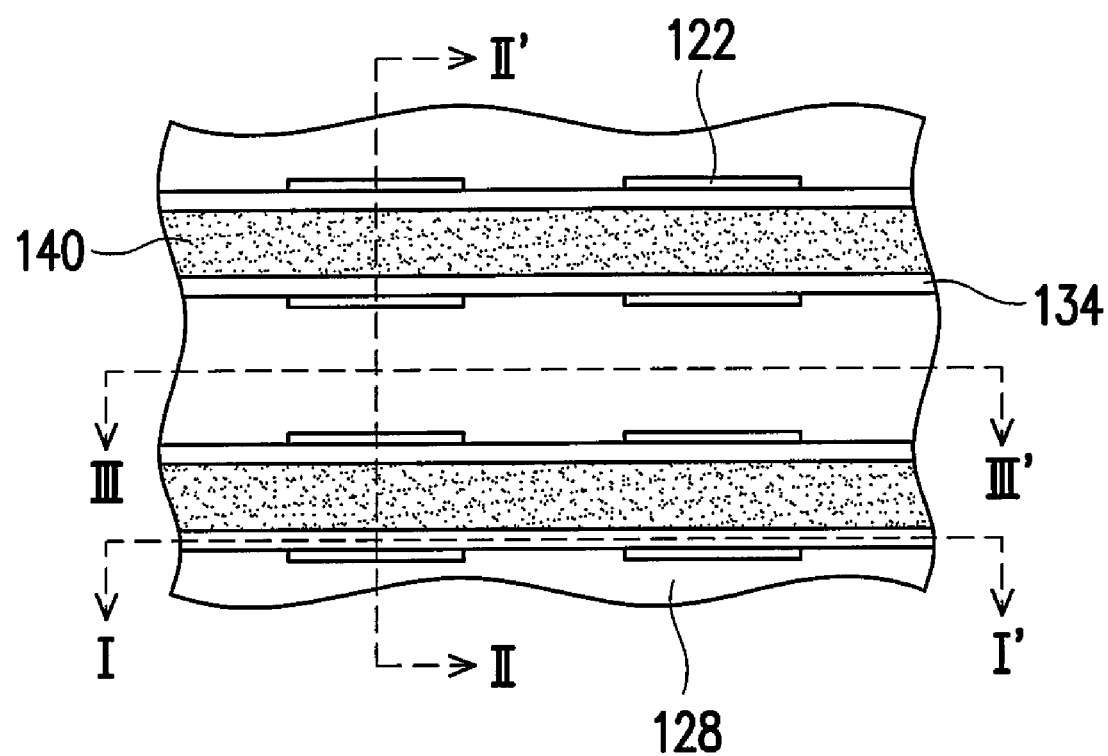
Figure 2C:
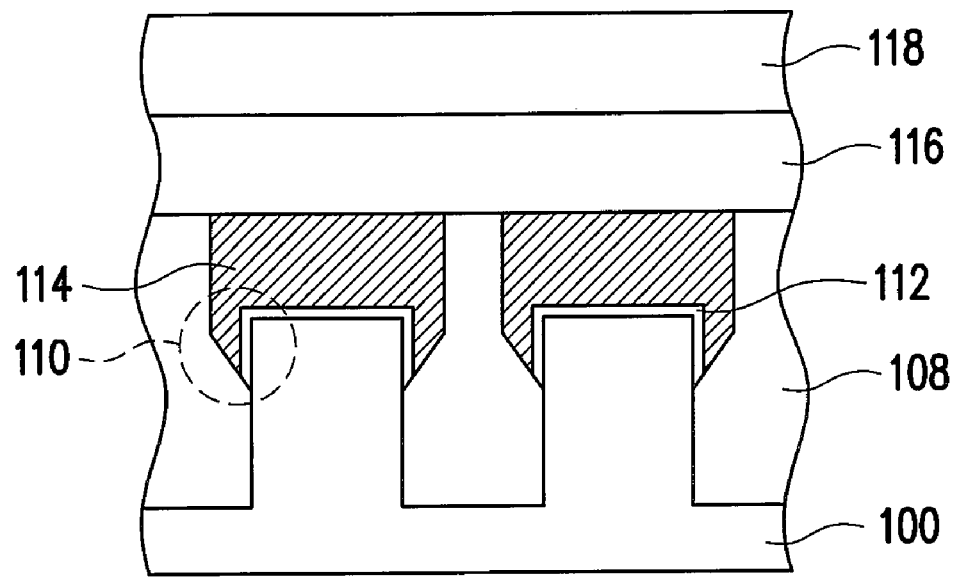
Figure 2D:
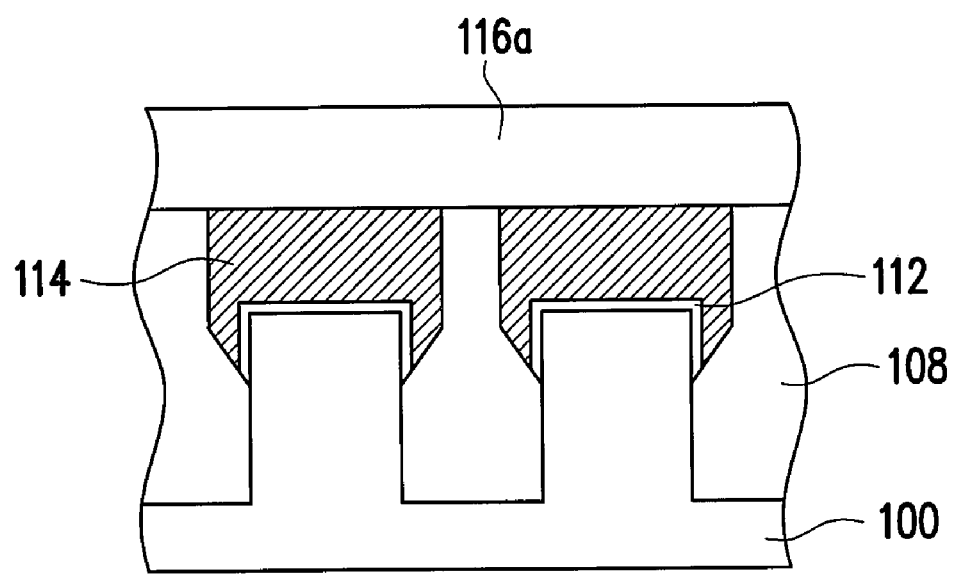
Figure 2E:
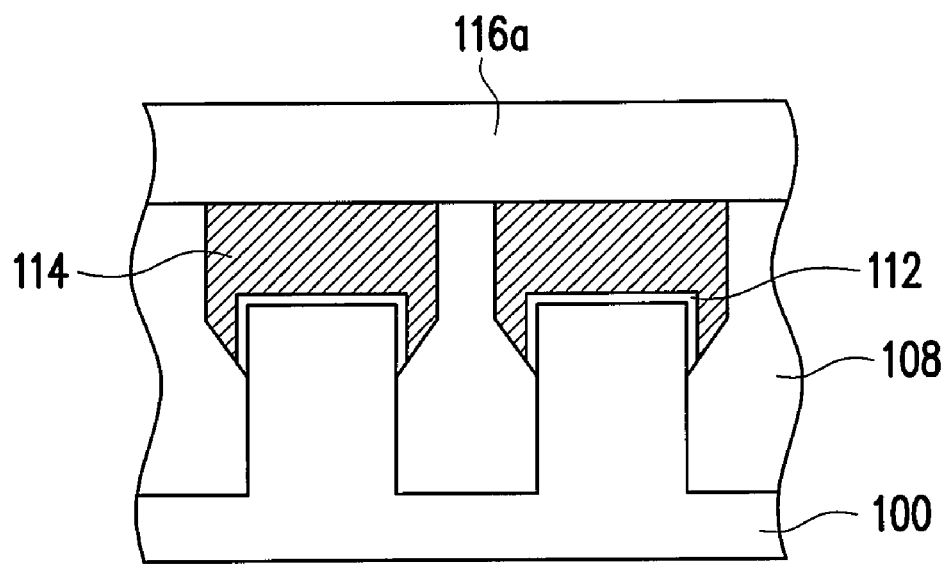
Figure 2F:
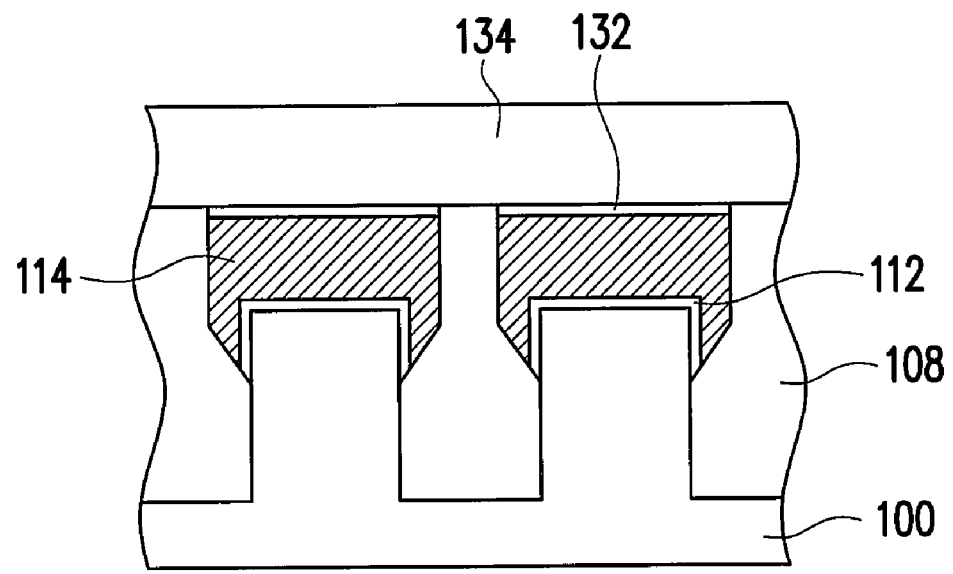
Figure 2G:
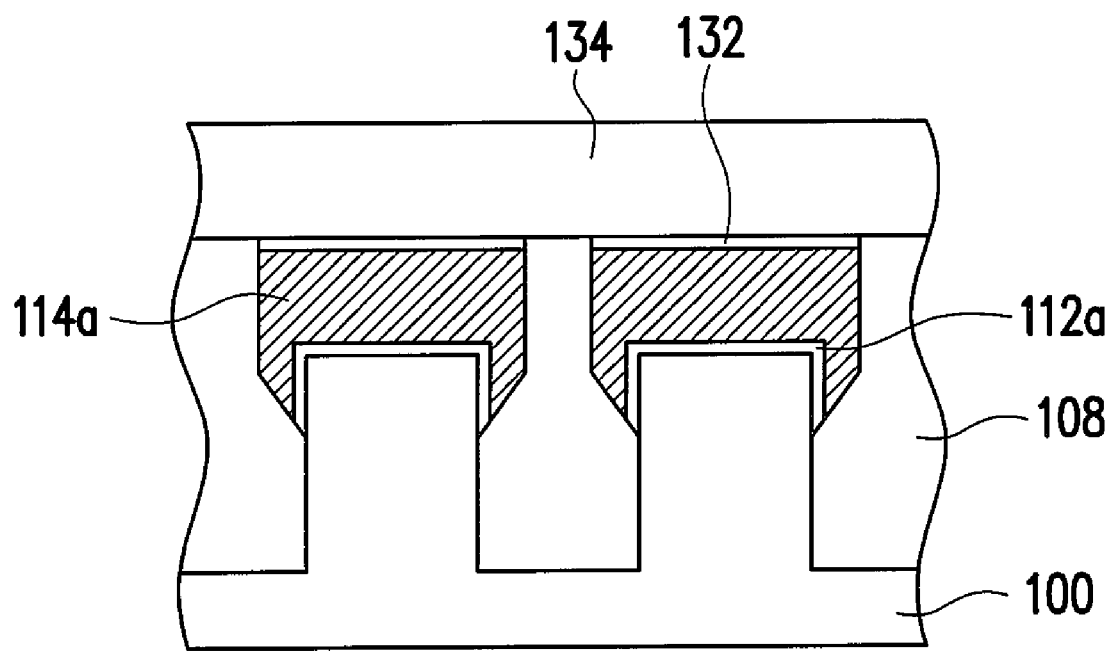
Figure 3C:
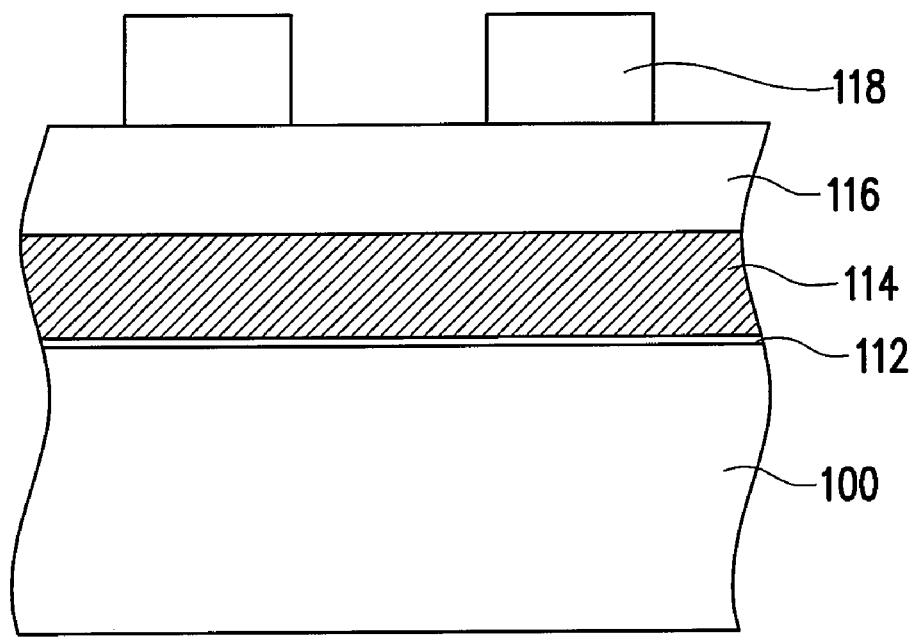
Figure 3D:
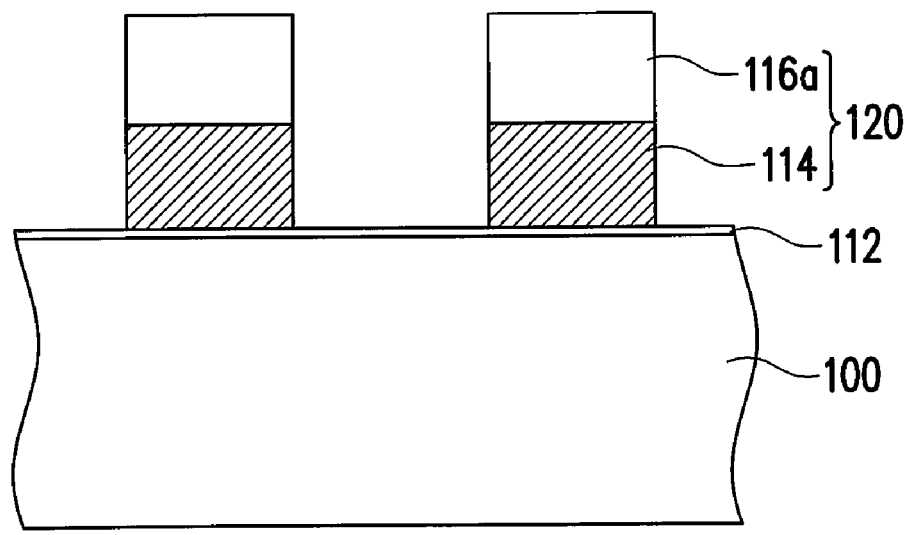
Figure 3E:
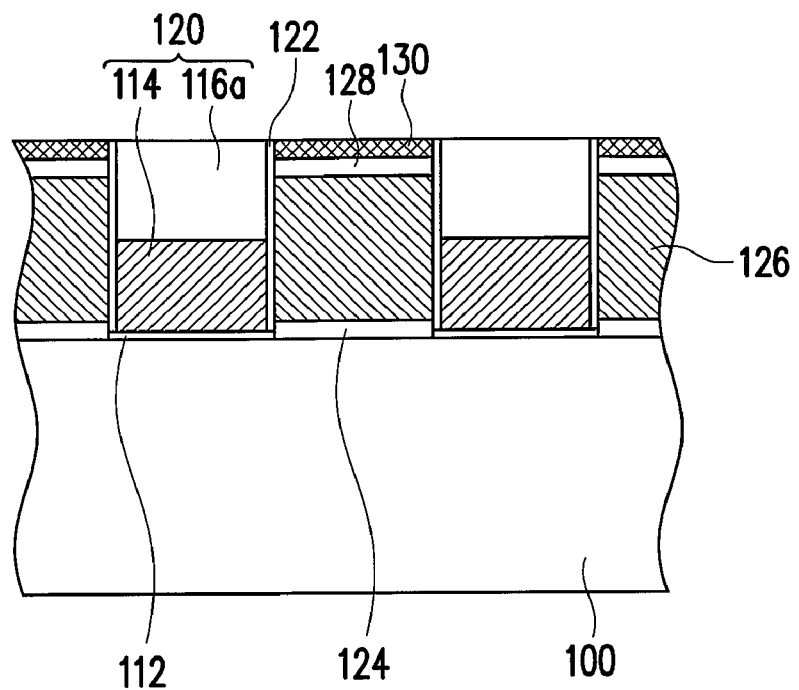
Figure 3F:
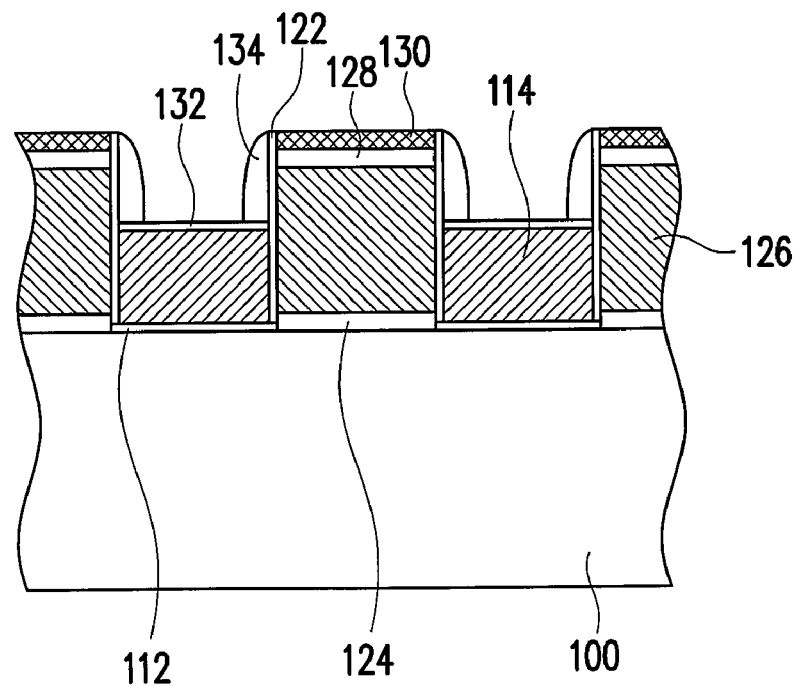
Figure 3G:
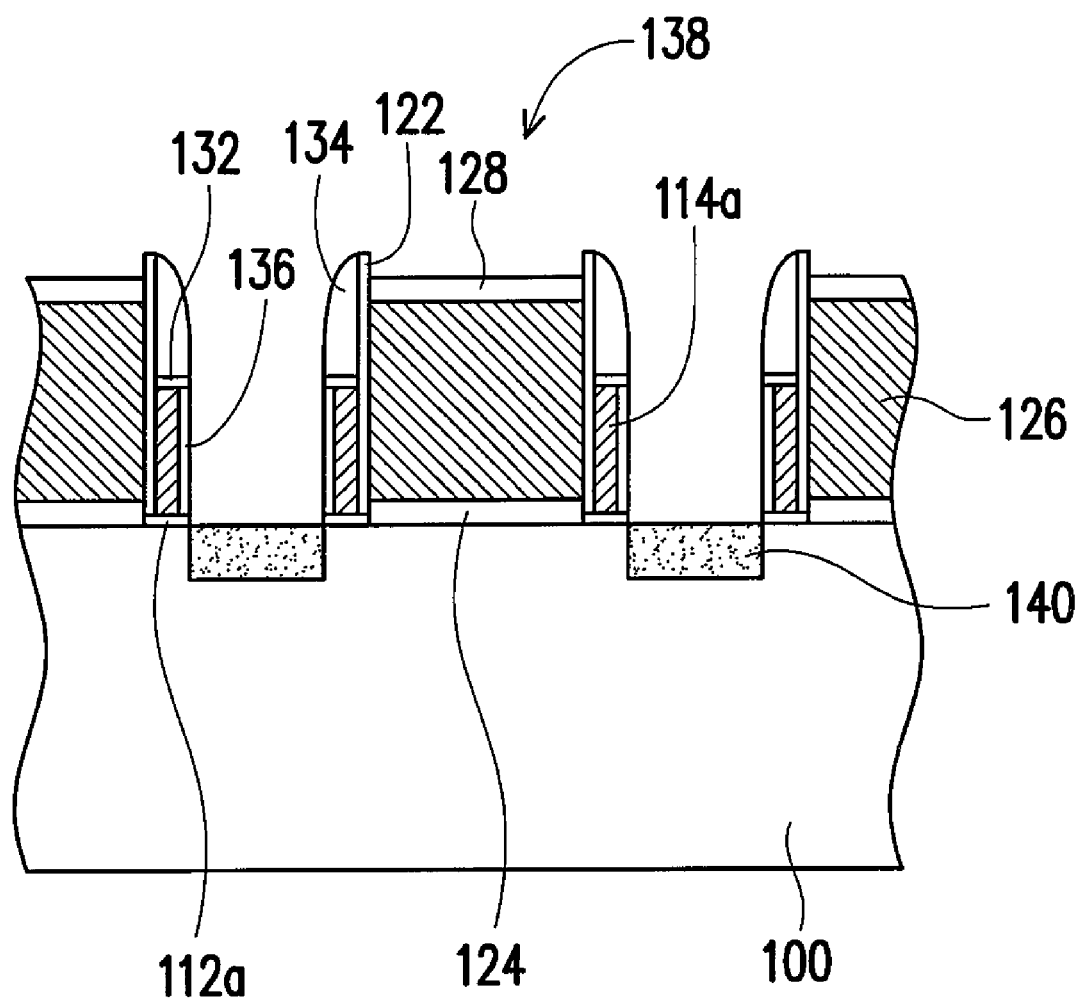
Figure 4A:
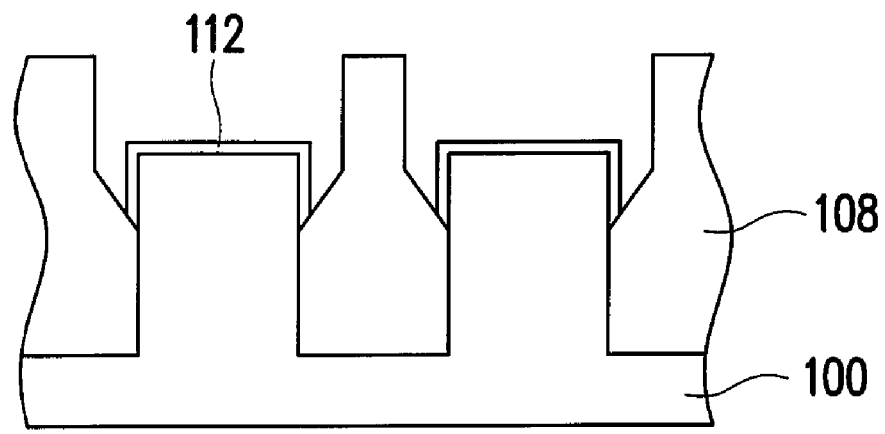
FIGS. 4A to 4D are schematic cross-sectional views along a line III-III' of FIGS. 1D to 1G.
Figure 4B:
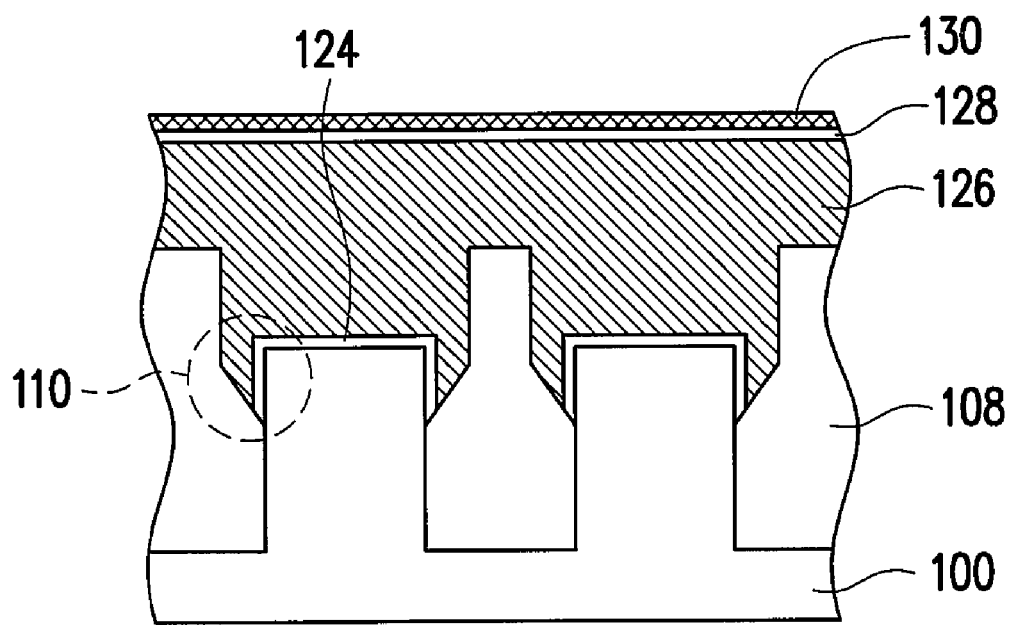
Figure 4C:
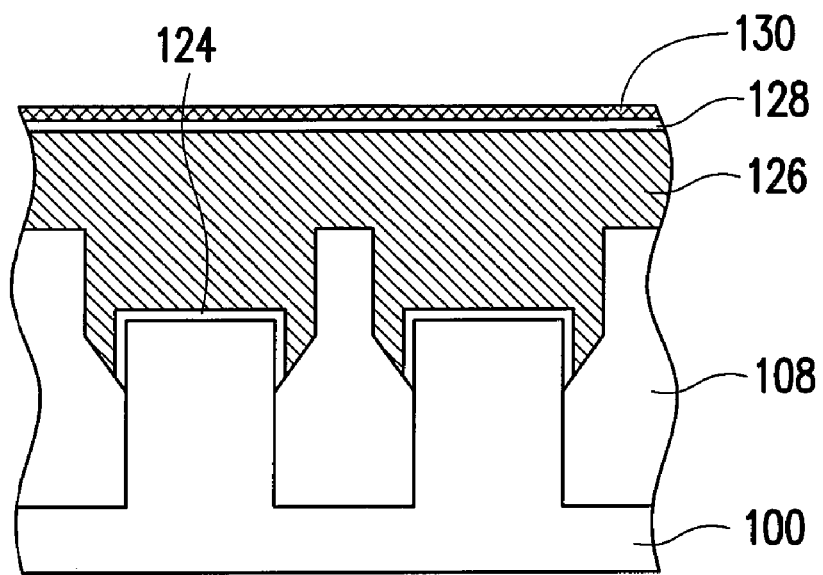
Figure 4D:
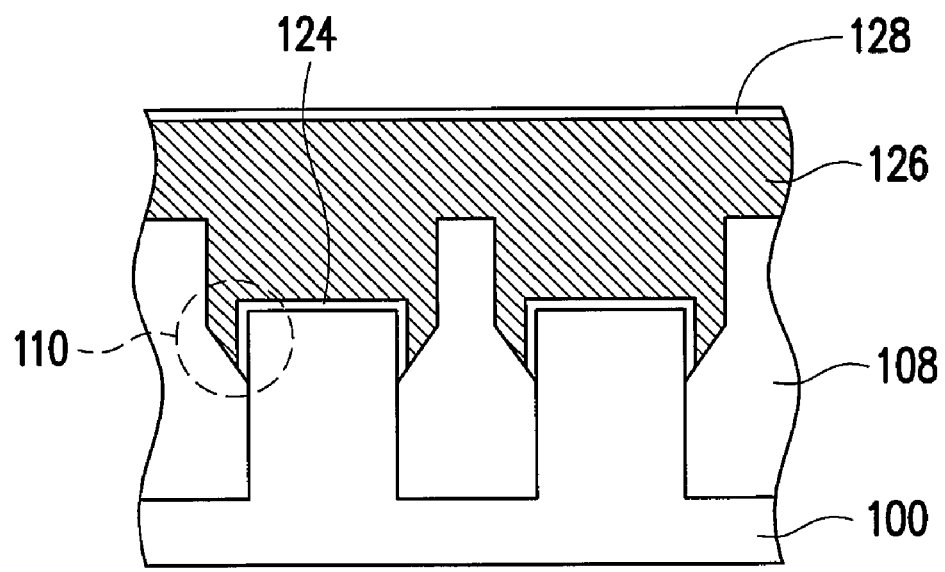

Then, referring to FIGS. 1C, 2C and 3C, a dielectric layer 112 is formed on the substrate 100. The material of the dielectric layer 112 includes silicon oxide, for example. The dielectric layer 112 is formed by performing the thermal oxidation process, for example. The dielectric layer 112 is used as the tunneling dielectric layer in the non-volatile memory. After that, a conductive layer 114 is provided on top of the dielectric layer 112 and completely fills the recess 110. The conductive layer 114 is formed by forming a conductive material layer (not shown) on the substrate 100 at first. The conductive material layer, being sandwiched by two adjacent isolation structures 108 and on top of the substrate 100, covers the dielectric layer 112 and completely fills the recess 110. The material of the conductive material layer includes, for example, doped polysilicon. Then, a planarization process is performed to remove a portion of the conductive material layer by using the chemical-mechanical polishing process until the isolation structure 108 is exposed.

Referring to FIGS. 1C, 2C and 3C, a cap layer 116 is formed on the substrate. The material of the cap layer 116 includes silicon nitride, for example. The cap layer is formed by, for example, performing a chemical vapor deposition process. Thereafter, a photolithography process is performed to form a patterned photoresist layer 118 on the cap layer 116, so as to define a control gate area.

After that, referring to FIGS. 1D, 2D, 3D and 4A, an etching process is performed to remove the cap layer 116 not covered by the patterned photoresist layer 118 by using the patterned photoresist layer 118 as a mask, so as to form bar-shaped cap layers 116a. The extending direction of the bar-shaped cap layers 116a is across that of the isolation structure 108. According to the present embodiment, the extending direction of the bar-shaped cap layers 116a is perpendicular to that of the isolation structure 108, for example. Then, the patterned photoresist layer 118 is removed. Next, an etching back process is performed to remove a portion of the isolation structure 108. Thereafter, an etching process is performed by using the bar-shaped cap layers 116a as the mask for removing the conductive layer 114 not covered by the bar-shaped cap layers 116a, so as to form gate structures 120. Thereby, when removing the conductive layer 114 not covered by the bar-shaped cap layers 116a in the subsequent process, the isolation structure 108 is not overly high and the conductive layer 114 can be removed completely. Therefore, the conductive layer 114 does not remain at the bottom to affect a device.

Referring to FIGS. 1E, 2E, 3E and 4B, a dielectric material layer (not shown) is conformally formed on the substrate 100. According to the present embodiment, the dielectric material layer is constituted by a silicon oxide/silicon nitride/silicon oxide composite layer. The dielectric material layer is formed by, for example, forming a first silicon oxide layer by performing a thermal oxidation process at first. Then, a silicon nitride layer is formed on the first silicon oxide layer by performing a chemical vapor deposition process. After that, a second silicon nitride layer is formed on the silicon nitride layer by performing another thermal oxidation process. Certainly, in a different embodiment, the dielectric material layer can be constituted only by silicon oxide. Then, a portion of both the dielectric material layer and the dielectric layer 112 thereunder are removed by, for example, performing a dry etching process, so as to form a dielectric layer 122 on the sidewalls of the gate structures 120, and to expose the substrate 100 between the gate structures 120. The dielectric layer 122 at the sidewalls of the gate structures 120 is used as the inter-gate dielectric layer in the non-volatile memory.

Referring to FIGS. 1E, 2E, 3E and 4B, a dielectric layer 124 is formed on the substrate 100 between the gate structures 120 by performing a thermal oxidation process. The dielectric layer 124 is used as the gate dielectric layer in the non-volatile memory. Then, a conductive material layer (not shown) constituted by doped polysilicon is deposited on the substrate 100, wherein the conductive material layer completely fills the gap between the gate structures 120 and the recess 110.

After that, a planarization process is performed by using the chemical-mechanical polishing process until the gate structures 120 are exposed, so as to form the conductive layer 126 used as the control gate in the non-volatile memory on the dielectric layer 124.

Referring to FIGS. 1E, 2E, 3E and 4B, an etching back process is performed to remove a portion of the conductive layer 126. Then, an oxidation process is performed on the remaining second conductive layer 126 to form a cap layer 128 thereon. The material of the cap layer 128 includes silicon oxide, for example. The cap layer 128 is formed by performing a thermal oxidation process, for example. After that, a metal hard mask layer 130 is formed on the cap layer 128. The material of the metal hard mask layer 130 includes, for example, polysilicon. The metal hard mask layer 130 is used as an etching mask when removing the bar-shaped cap layers 116a and a portion of the isolation structure 108 in the subsequent process. The cap layer 128 is used as an etching mask when forming the floating gate subsequently.

Thereafter, referring to FIGS. 1F, 2F, 3F and 4C, the bar-shaped cap layers 116a are removed. After that, a first oxidation process is performed on the conductive layer 114, so as to form an oxidation layer 132 on the conductive layer 114. Afterwards, a spacer material layer (not shown) is conformally formed on the substrate 100. The material of the spacer material layer includes, for example, silicon nitride. Then, a portion of the spacer material layer is removed by performing a dry etching process, so as to form a spacer 134 on the sidewalls of the conductive layer 126. Next, an etching back process is performed to remove a portion of the isolation structure 108. Thereby, when removing a portion of the conductive layer 126 to form the floating gate by performing an etching process subsequently, the isolation structure 108 is not overly high, such that the conductive layer 126 can be removed completely. Therefore, the conductive layer 126 does not remain at the bottom to affect the device.

After that, referring to FIGS. 1G, 2G, 3G and 4D, an etching process is performed by using the spacer 134 as the mask, so as to remove a portion of the oxidation layer 132, the conductive layer 114 and the dielectric layer 112 thereunder for exposing the substrate 100, and a conductive layer 114a used as the floating gate in the non-volatile memory and a dielectric layer 112a used as the tunneling dielectric layer in the non-volatile memory are simultaneously formed. Certainly, the metal hard mask layer 130 is also removed in the aforesaid etching process. Then, an oxidation process is performed on the conductive layer 114a to form an oxidation layer 136, so that manufacture of a gate structure 138 in the non-volatile memory is completed. Afterwards, an ion implanting process is performed on the substrate 100 at two sides of the gate structure 138, so as to form a doped region 140 in the substrate 100 at two sides of the gate structure 138. Thereby, manufacture of the non-volatile memory is completed.

In light of the above, according to the present invention, after the isolation structure is formed in the trench, a portion of the isolation structure is removed by performing the wet etching process to form the recess between the top portion of the trench and the isolation structure, and thereby the conductive layers respectively used as the floating gate and the control gate can be filled into the recess for forming the floating gate and the control gate with a larger size in the subsequent process, so as to increase the overlap area between the floating gate and the control gate, to increase the coupling ratio of the device and to improve the operation efficiency of the device.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for manufacturing a non-volatile memory, the method comprising:
    forming a shallow trench isolation structure in a trench of a substrate;
    defining a recess between a top portion of the trench and the shallow trench isolation structure;
    forming a first dielectric layer on the substrate;
    forming a first conductive layer on the first dielectric layer and in the recess;
    forming a plurality of bar-shaped cap layers on the substrate to be oriented in a direction perpendicular to that of the isolation structure;
    forming a plurality of first gate structures by partially removing the first conductive layer;
    forming a second dielectric layer on sidewalls of the first gate structures;
    forming a third dielectric layer on the substrate between two adjacent first gate structures;
    forming a second conductive layer on the third dielectric layer;
    forming a plurality of second gate structures by removing the bar-shaped cap layers and a portion of the first conductive layer; and
    forming a doped region in the substrate at two opposite sides of each of the second gate structures.

2. The method for manufacturing the non-volatile memory according to claim 1, wherein the recess defining step is performed by performing a wet etching process.

3. The method for manufacturing the non-volatile memory according to claim 1, wherein the steps of forming the trench comprises:
    forming a pad layer and a hard mask layer on the substrate sequentially; and
    performing a patterning process.

4. The method for manufacturing the non-volatile memory according to claim 3, wherein the isolation structure forming step is performed by performing:
    filling the trench with an isolation material; and
    removing excessive hard mask layer outside the trench.

5. The method for manufacturing the non-volatile memory according to claim 4, wherein the first dielectric layer forming step is performed by performing a thermal oxidation process.

6. The method for manufacturing the non-volatile memory according to claim 1, wherein the first conductive layer forming step comprises:
    forming a conductive material layer on the substrate, the conductive material layer covering the isolation structure and completely filling the recess; and
    removing a portion of the conductive material layer to expose the isolation structure.

7. The method for manufacturing the non-volatile memory according to claim 5, wherein the method further comprising performing an etching back process to remove a portion of the isolation structure after the bar-shaped cap layers forming step and before the first gate structure forming step.

8. The method for manufacturing the non-volatile memory according to claim 7, wherein the second dielectric layer forming step is performed by performing:
    conformally forming a dielectric material layer on the substrate; and
    performing a dry etching process.

9. The method for manufacturing the non-volatile memory according to claim 8, wherein the third dielectric layer forming step is performed by performing a thermal oxidation process.

10. The method for manufacturing the non-volatile memory according to claim 9, wherein the second conductive layer forming step is performed by performing:
    forming a conductive material layer on the substrate, the conductive material layer completely filling a gap between two adjacent first gate structures; and
    removing a portion of the conductive material layer to expose the first gate structures.

11. The method for manufacturing the non-volatile memory according to claim 10 further comprising:
    removing a portion of the second conductive layer;
    performing an oxidation process on the remaining second conductive layer to form a cap layer thereon; and
    forming a metal hard mask layer on the cap layer, after forming the second conductive layer and before removing the bar-shaped cap layers and a portion of the first conductive layer.

12. The method for manufacturing the non-volatile memory according to claim 11, wherein the second gate structure forming step further comprises:
    performing a first oxidation process on the first conductive layer and forming a spacer on sidewalls of the second conductive layer after removing the bar-shaped cap layers and before removing a portion of the first conductive layer;
    removing a portion of the first conductive layer by using the spacer as a mask; and
    performing a second oxidation process on the remaining first conductive layer.

13. The method for manufacturing the non-volatile memory according to claim 12 further comprising performing an etching back process to remove a portion of the isolation structure after forming the spacer and before removing a portion of the first conductive layer.

14. The method for manufacturing the non-volatile memory according to claim 13, wherein the isolation structure has a height higher than that of the substrate.

15. The method as claimed in claim 14, wherein the recess is defined between the isolation structure and a side wall of the trench.

16. A method for manufacturing a non-volatile memory, the method comprising:
    forming a shallow trench isolation structure in a trench of a substrate;
    defining a recess between a top portion of the trench and the shallow trench isolation structure;
    forming a first dielectric layer on the substrate;
    forming a first conductive layer on the first dielectric layer, wherein the first conductive layer completely fills the recess;
    forming a plurality of bar-shaped cap layers on the substrate to be oriented in a direction perpendicular to that of the isolation structure;
    forming a plurality of first gate structures by partially removing the first conductive layer;
    forming a second dielectric layer on sidewalls of the first gate structures;
    forming a third dielectric layer on the substrate between two adjacent first gate structures;
    forming a second conductive layer on the third dielectric layer;

forming a plurality of second gate structures by removing the bar-shaped cap layers and a portion of the first conductive layer; and forming a doped region in the substrate at two opposite sides of each of the second gate structures.

17. The method for manufacturing the non-volatile memory according to claim 16, wherein the recess defining step is performed by performing a wet etching process.

18. The method for manufacturing the non-volatile memory according to claim 16, wherein the steps of forming the trench comprises:

forming a pad layer and a hard mask layer on the substrate sequentially; and performing a patterning process.

19. The method for manufacturing the non-volatile memory according to claim 18, wherein the isolation structure forming step is performed by performing:

filling the trench with an isolation material; and removing excessive hard mask layer outside the trench.

20. The method for manufacturing the non-volatile memory according to claim 19, wherein the first dielectric layer forming step is performed by performing a thermal oxidation process.

21. The method for manufacturing the non-volatile memory according to claim 16, wherein the first conductive layer forming step comprises:

forming a conductive material layer on the substrate, the conductive material layer covering the isolation structure and completely filling the recess; and removing a portion of the conductive material layer to expose the isolation structure.

22. The method for manufacturing the non-volatile memory according to claim 20, wherein the method further comprising performing an etching back process to remove a portion of the isolation structure after the bar-shaped cap layers forming step and before the first gate structure forming step.

23. The method for manufacturing the non-volatile memory according to claim 22, wherein the second dielectric layer forming step is performed by performing:

conformally forming a dielectric material layer on the substrate; and performing a dry etching process.

24. The method for manufacturing the non-volatile memory according to claim 23, wherein the third dielectric layer forming step is performed by performing a thermal oxidation process.

25. The method for manufacturing the non-volatile memory according to claim 24, wherein the second conductive layer forming step is performed by performing:

forming a conductive material layer on the substrate, the conductive material layer completely filling a gap between two adjacent first gate structures; and removing a portion of the conductive material layer to expose the first gate structures.

26. The method for manufacturing the non-volatile memory according to claim 25 further comprising:

removing a portion of the second conductive layer;

performing an oxidation process on the remaining second conductive layer to form a cap layer thereon; and forming a metal hard mask layer on the cap layer, after forming the second conductive layer and before removing the bar-shaped cap layers and a portion of the first conductive layer.

27. The method for manufacturing the non-volatile memory according to claim 26, wherein the second gate structure forming step further comprises:

performing a first oxidation process on the first conductive layer and forming a spacer on sidewalls of the second conductive layer after removing the bar-shaped cap layers and before removing a portion of the first conductive layer;

removing a portion of the first conductive layer by using the spacer as a mask; and performing a second oxidation process on the remaining first conductive layer.

28. The method for manufacturing the non-volatile memory according to claim 27 further comprising performing an etching back process to remove a portion of the isolation structure after forming the spacer and before removing a portion of the first conductive layer.

29. The method for manufacturing the non-volatile memory according to claim 28, wherein the isolation structure has a height higher than that of the substrate.

30. The method as claimed in claim 14, wherein the recess is defined between the isolation structure and a side wall of the trench.

* * * * *